United States Patent [19]

Lowenschuss

[11] 4,137,497
[45] Jan. 30, 1979

[54] FREQUENCY MEASURING APPARATUS

[75] Inventor: Oscar Lowenschuss, Goleta, Calif.

[73] Assignee: Raytheon Company, Lexington, Mass.

[21] Appl. No.: 847,381

[22] Filed: Oct. 31, 1977

[51] Int. Cl.$^2$ ............................................. G01R 23/02
[52] U.S. Cl. ................................. 324/78 F; 324/79 D
[58] Field of Search .............................. 332/1; 331/43; 324/77 R, 77 E, 78 R, 78 F, 78 Z, 79 R, 79 D

[56] References Cited

U.S. PATENT DOCUMENTS 3,984,769  10/1976  Williams .............................. 324/78 F Primary Examiner—M. Tokar
Attorney, Agent, or Firm—Richard M. Sharkansky; Joseph D. Pannone

[57] ABSTRACT

A frequency measuring apparatus is disclosed wherein a plurality of sets of harmonic signals is mixed with a received signal to produce a plurality of groups of beat frequency signals. A plurality of filters, each one being fed by a corresponding one of the groups of beat frequency signals, is provided to reject the beat frequency signals in such group having frequencies greater than one-half the fundamental frequency of the set of signals producing the group of beat frequency signals fed to such one of the filters. A plurality of counters, each one coupled to the output of a corresponding one of the filters, converts the frequency of the beat frequency signals fed to such counter to corresponding digital words. A logic network is provided to calculate the frequency of the received signal from the digital words provided by the counter.

12 Claims, 7 Drawing Figures

4,137,497

FREQUENCY MEASURING APPARATUS

BACKGROUND OF THE INVENTION

This invention relates generally to frequency measuring apparatus and more particularly to instantaneous frequency measurement (IFM) apparatus adapted for use in determining the frequency of radio frequency signals.

As is known in the art, instantaneous frequency measurement apparatus generally include analog components, such as delay lines and frequency discriminator circuits, to determine the frequency of radio frequency signals. While such apparatus may be adequate in many applications they are generally large in size and relatively expensive. The use of digital components as digital counters in the GHz frequency range has heretofore generally not been successful because such counters cannot accurately respond to signals having frequencies in the GHz frequency range.

SUMMARY OF THE INVENTION

With this background of the invention in mind it is therefore an object of this invention to provide an improved frequency measuring apparatus adapted for use with radio frequency signals and employing digital processing circuitry.

This and other objects of the invention are attained generally by providing a frequency measuring apparatus, comprising: oscillator means for producing a plurality of sets of signals, each set of signals being harmonic signals of a different fundamental frequency signal; heterodyning means for mixing an input signal with the sets of signals producing a plurality of groups of beat frequency signals, each group of beat frequency signals being produced by mixing the input signal with a corresponding one of the sets of signals; a plurality of filters, each one fed by a corresponding one of the group of beat frequency signals for rejecting the beat frequency signals in such group having frequencies greater than one-half the fundamental frequency of the set of signals producing the group of beat frequency signals fed to such one of the filters; a plurality of counter means, each one being coupled to the output of a corresponding one of the filters, for converting the plurality of beat frequency signals passed thereto by the filters to a corresponding plurality of digital words; and logic means, responsive to the digital words, for determining the frequency of the input signal.

In a preferred embodiment of the invention the oscillator means produces three sets of harmonic signals, such sets being harmonics of fundamental frequency signals having frequencies $f_1$, $f_2$, $f_3$. Each set of signals is fed to a mixer. Also fed to the mixers is the input signal. Therefore, each mixer produces a group of beat frequency signals. The group of beat frequency signals produced by mixing the input signal with the set of signals which includes harmonics of frequency $f_1$ are fed to a first filter which rejects those signals in the series having frequencies greater than $f_1/2$. Likewise, the series of beat frequency signals produced by mixing the input signal with the set of signals which includes harmonics of frequency $f_2$ are fed to a second filter which rejects those signals in the series having frequencies greater than $f_2/2$. Still likewise the series of beat frequency signals produced by mixing the input signal with the set of signals which includes harmonics of the frequency $f_3$ are fed to a third filter which rejects those signals in the series having frequencies greater than $f_3/2$. The frequencies $f_1/2$, $f_2/2$ and $f_3/2$ are in the order of 600 MHz while the bandwidth of the frequency measuring apparatus is from approximately 3–17 GHz. Each one of the filters is coupled to a corresponding one of the counters. On detection of the presence of an input signal the three counters are enabled to count the cycles of the beat frequency signals fed thereto by the filters for a predetermined time period. At the end of this time period it follows that each counter produces a digital word representative of the frequency of the beat frequency signal fed thereto. It is noted that because the maximum frequency of the beat frequency signal is in the order of 600 MHz the counters are able to properly respond to such signals. A logic network responds to the relative magnitudes of the digital words and the differences between selected ones of the digital words to determine the frequency of the input signal.

With such an arrangement the input signal becomes converted into three groups of beat frequency signals. In the general case one beat frequency signal in each of the three goups has a frequency within the bandwidth of a corresponding one of the three filters. These three beat frequency signals were produced by heterodyning the input signal with one of the harmonic signals in each of the three sets of harmonic signals. The counters measure the frequencies of the three beat frequency signals. The logic network determines, in effect, which ones of the harmonic signals in each of the three sets thereof produced the three beat frequency signals by determining the frequency separation of the three beat frequency signals. The frequency of the input signal is then computed by determining, additionally, the relative frequencies of the beat frequency signals. In order to prevent the counter from responding to low frequency noise the filters also reject beat frequency signals having frequencies less than 60 MHz. However, because of the particular frequency separation selected for the fundamental frequencies, unambiguous results are still obtainable over a relatively wide bandwidth.

BRIEF DESCRIPTION OF THE DRAWINGS

The foregoing features of this invention, as well as the invention itself, may be more fully understood from the following detailed description read together with the accompanying drawings in which.

DESCRIPTION OF THE PREFERRED EMBODIMENT

Figure 1:
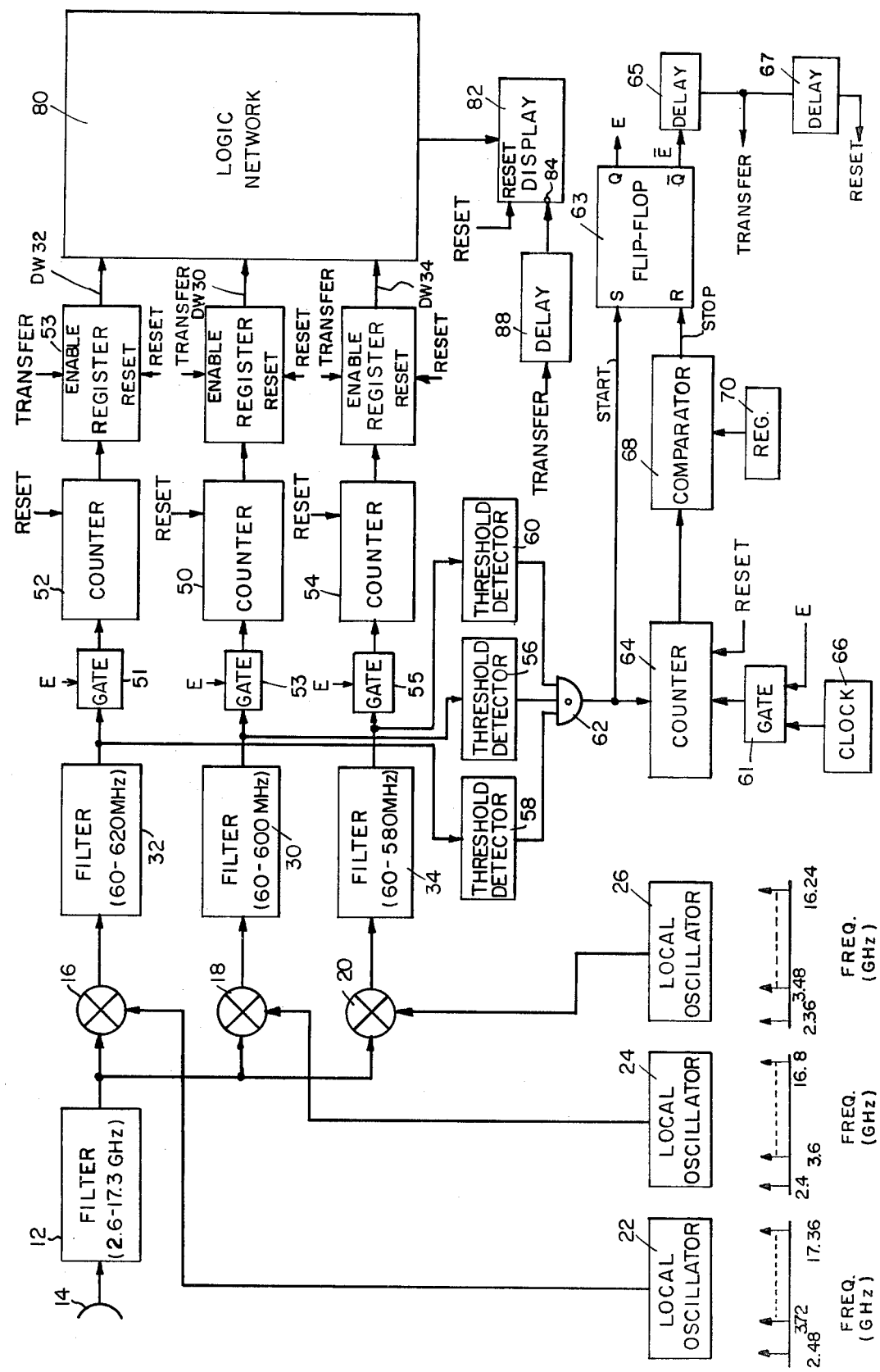
FIG. 1 is a block diagram of a frequency measuring apparatus according to the invention.

Referring now to FIG. 1, a frequency measuring apparatus 10 is shown to include a bandpass filter 12 fed by radio frequency signals received by conventional antenna 14. The bandwidth of the bandpass filter 12 is here 2.6 to 17.3 GHz. The radio frequency signals passed by bandpass filter 12 are fed to a plurality of, here three, mixers 16, 18, 20, as shown. A plurality of, here three, local oscillators 22, 24, 26 are provided.

Local oscillator 22 is coupled to mixer 16, local oscillator 24 is coupled to mixer 18 and local oscillator 26 is coupled to mixer 20, as shown. Local oscillators 22, 24, 26 are here of any conventional design and here include step recovery diodes such as series A4S300, A4S100 manufactured by Aertech Industries, Sunnyvale, Calif. or series 5082 manufactured by Hewlett Packard, Palo Alto, Calif. 94304. Here local oscillator 22 produces the second through fourteenth harmonics of a fundamental frequency of 1.24 GHz; local oscillator 24 produces the second through fourteenth harmonics of a fundamental frequency of 1.2 GHz; and local oscillator 26 produces the second through fourteenth harmonics of fundamental frequency of 1.16 GHz. That is, local oscillators 22, 24, 26 produce a plurality of, here three, sets of harmonic signals, each set of signals being harmonics of a different fundamental frequency, i.e. 1.24, 1.2 and 1.16 GHz, respectively.

Figure 2:
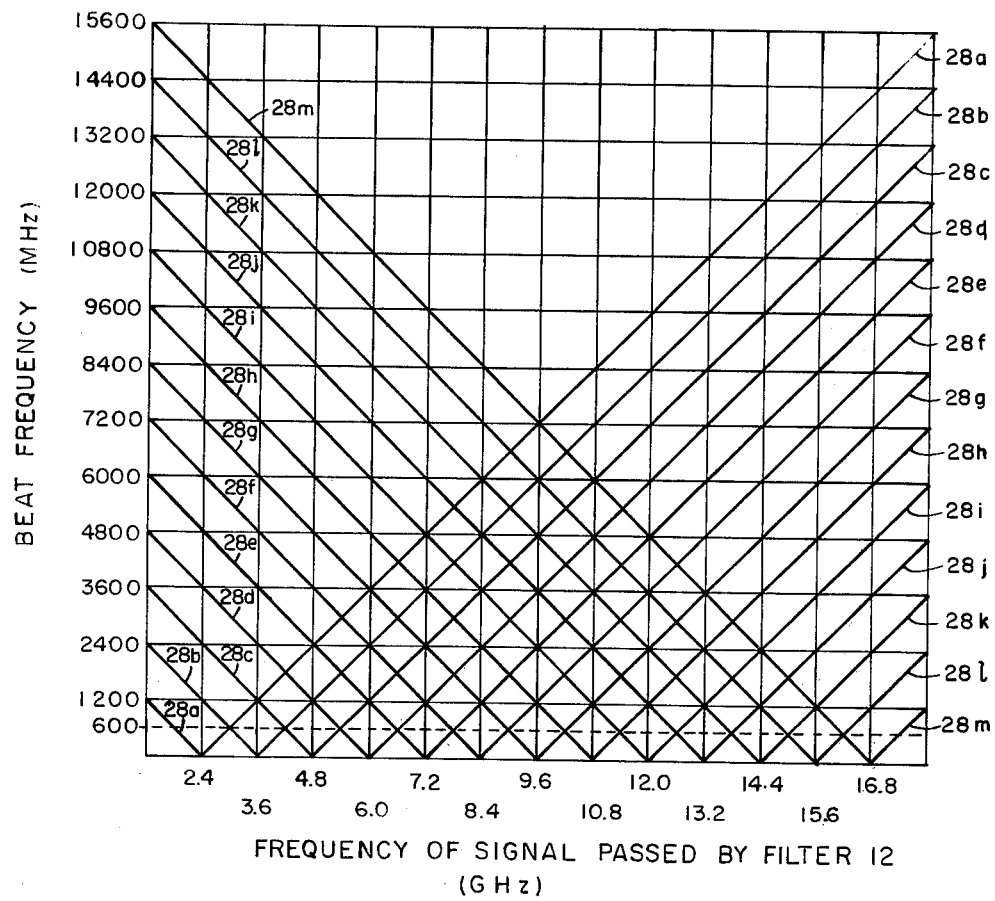
FIGS. 2-5 are diagrams useful in understanding the operation of the frequency measuring apparatus shown in FIG. 1.
Figure 3:
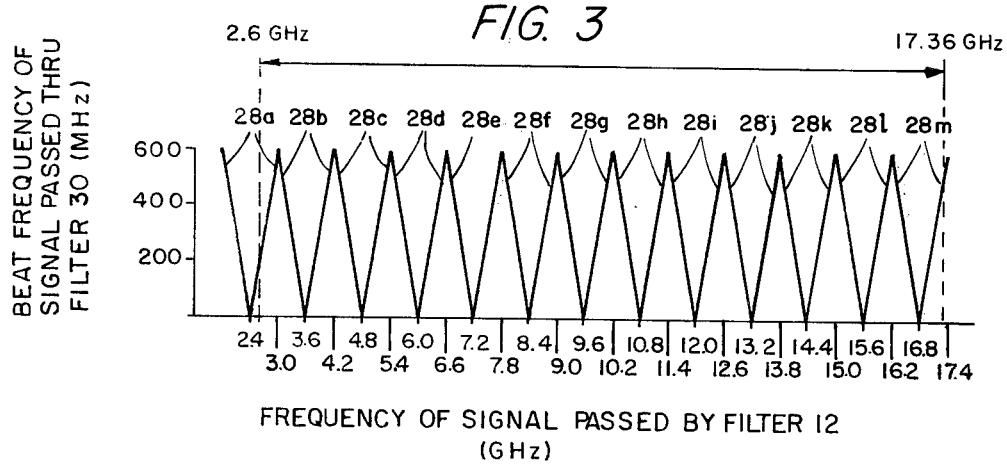

Referring now first to mixer 18, it is noted that when the signal passed by filter 12 is heterodyned with the set of harmonic signals produced by local oscillator 24, a group of thirteen pairs of beat frequency signals is produced, each one pair being associated with a corresponding one of the harmonics heterodyned with the signal passed by filter 12. The relationship between the beat frequency and the frequency of the signal passed by filter 12 for each of the thirteen beat frequency signal pairs is shown in FIG. 2, curves 28a–28m being associated with the beat frequency signals produced by the second through fourteenth harmonics, i.e. frequencies 2.4 through 16.8 GHz, respectively. The beat frequency signals produced by mixer 18 are fed to a filter 30. Filter 30 is of any conventional design and here rejects all signals having frequencies greater than 600 MHz. It is noted that the cutoff frequency, 600 MHz, is equal to half the fundamental frequency associated with the set of harmonic signals produced by local oscillator 24. The effect of filter 30 in rejecting such signals is shown by the curve in FIG. 3. (It is noted that filter 30 also rejects signals having frequencies less than 60 MHz in order to remove noise but the effect of such rejection is here not considered for purposes of explanation.) It is noted that while a group of thirteen pairs of beat frequency signals is produced by mixer 18, as discussed in connection with FIG. 2, only one beat frequency signal in such group will pass through filter 30. For example, if the signal passing through filter 12 has a frequency within the band 2.6 to 3.0 GHz thirteen groups of beat frequency signals are produced after mixing with the signals produced by local oscillator 24. However, only the beat frequency signal produced by mixing with the 2.4 GHz signal produced by local oscillator 24 will pass through filter 30. Likewise, signals passed by filter 12 having frequencies within bands 3.0 → 4.2 GHz; 4.2 → 5.4 GHz; 5.4 → 6.6 GHz; 6.6 → 7.8 GHz; 7.8 → 9.0 GHz; 9.0 → 10.2 GHz; 10.2 → 11.4 GHz; 11.4 → 12.6 GHz; 12.6 → 13.8 GHz; 13.8 → 15.0 GHz; 15.0 → 16.2 GHz; and 16.2 → 17.3 GHz will pass through filter 30 when heterodyned in mixer 18 with signals produced by local oscillator having frequencies 3.6 GHz (3 × 1.2 GHz); 4.8 GHz (4 × 1.2 GHz); 6.0 GHz (5 × 1.2 GHz); 7.2 GHz (6 × 1.2 GHz); 8.4 GHz (7 × 1.2 GHz); 9.6 GHz (8 × 1.2 GHz); 10.8 GHz (9 × 1.2 GHz); 12.0 GHz (10 × 1.2 GHz); 13.2 GHz (11 × 1.2 GHz); 14.4 GHz (12 × 1.2 GHz); 15.6 GHz (13 × 1.2 GHz) and 16.8 GHz (14 × 1.2 GHz), respectively.

Figure 4:
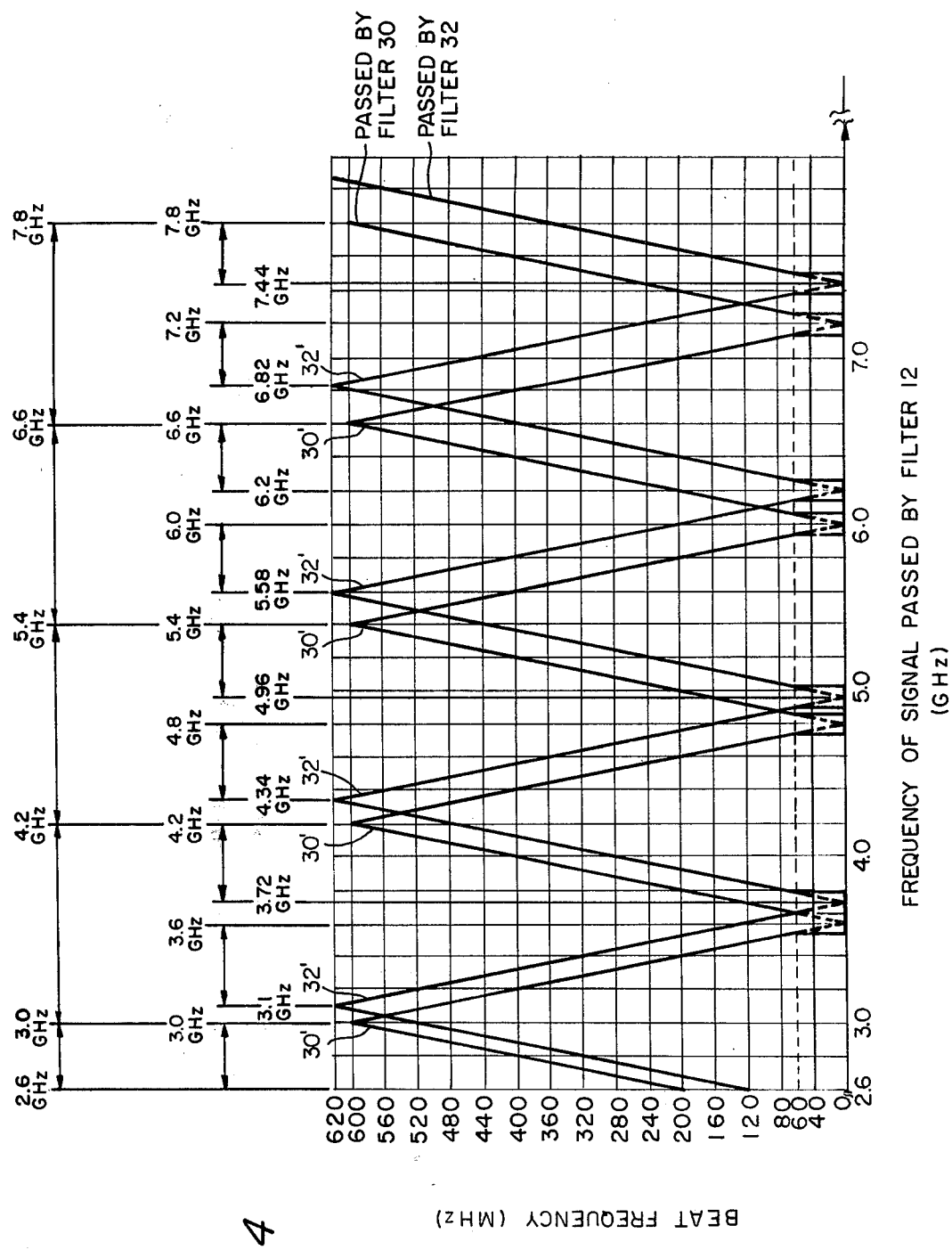

Considering now mixer 16, local oscillator 22 it is noted that the output of mixer 16 is coupled to a bandpass filter 32. Bandpass filter 32 is of any conventional design and rejects signals passed thereto having frequencies greater than 620 MHz. It is noted that such cutoff frequency is equal to one-half the fundamental frequency of the harmonic signals fed to mixer 16. (It is also noted that filter 32 rejects signals having frequencies lower than 60 MHz to remove noise, the effect of which will be discussed later.) The mixer 16 therefore produces a group of thirteen beat frequency signal pairs, each beat frequency signal passing through filter 32 as a result of a corresponding one of the harmonics produced by mixer 16 in a manner similar to that discussed in connection with mixer 18. The relationship between the beat frequency and each of the beat frequency signals passed by filter 32 as a function of the frequency of the signal passed by filter 12 is shown by the curve 32' in FIG. 4 for the lower portion of the operating band. Also in FIG. 4 is a curve 30' showing the relationship between the beat frequency of beat frequency signals passed by filter 30 as a function of the frequency of the signal passed by filter 12. Considering a signal passed by filter 12 having a frequency within the band 2.6 GHz to 3.0 GHz it is noted that between 2.6 and 3.0 GHz the frequency of the beat frequency signal passed by filter 32 and the frequency of the beat frequency signal passed by filter 30 differ by a fixed amount, 80 MHz. Also, if the signal passed by filter 12 is in the band 2.6 to 3.0 GHz the frequency of the beat frequency signal passed by filter 30 is greater than the frequency of the beat frequency signal passed by filter 32. Considering next a signal passed by filter 12 having a frequency within the band 3.0 to 4.2 GHz, it is noted that in the bands 3.1 to 3.6 GHz and 3.7 to 4.24 GHz a fixed difference in frequency exists between the signals passed by filters 30, 32, in particular 120 MHz. It is next noted that this fixed difference frequency is greater than the 80 MHz difference frequency associated with the frequency band 2.6 to 3.0 GHz. It is further noted that in the band 3.1 to 3.6 GHz the frequency of the signal out of filter 32 is greater than that out of filter 30 and in the band 3.72 to 4.24 GHz the frequency of the signal out of filter 30 is greater than the frequency of the signal out of filter 32. It is still further noted that in the bands 2.6 to 3.0 GHz and 3.0 to 4.2 GHz the fixed difference frequency relationships do not hold at the extremities of the curves, i.e. where the beat frequency is low or high. Therefore, if the frequency of the signal passed by the filter 12 is in a band where a fixed difference in frequency exists, the frequency of such signal may be determined by the amount of such fixed difference frequency and by knowing which filter produces a signal with the greater frequency. In particular, the frequency may be determined in accordance with the following:

If the frequency of the signal out of filter 30, $f_{30}$ is greater than the frequency of the signal out of filter 32, $f_{32}$, then the frequency f of the signal passed by filter 12 is $$f = (1.2 \text{GHz}) \frac{(f_{30} - f_{32})}{40} + 10^{-3}(f_{30}) \text{ GHZ} \quad (1)$$

(where $f_{30}$ and $f_{32}$ are in MHz); and if the $f_{32} > f_{30}$, then $$f = 1.24 \text{ GHz} \frac{(f_{32} - f_{30})}{40} - 10^{-3}f_{32} \text{ GHZ} \quad (2)$$

Figure 5:
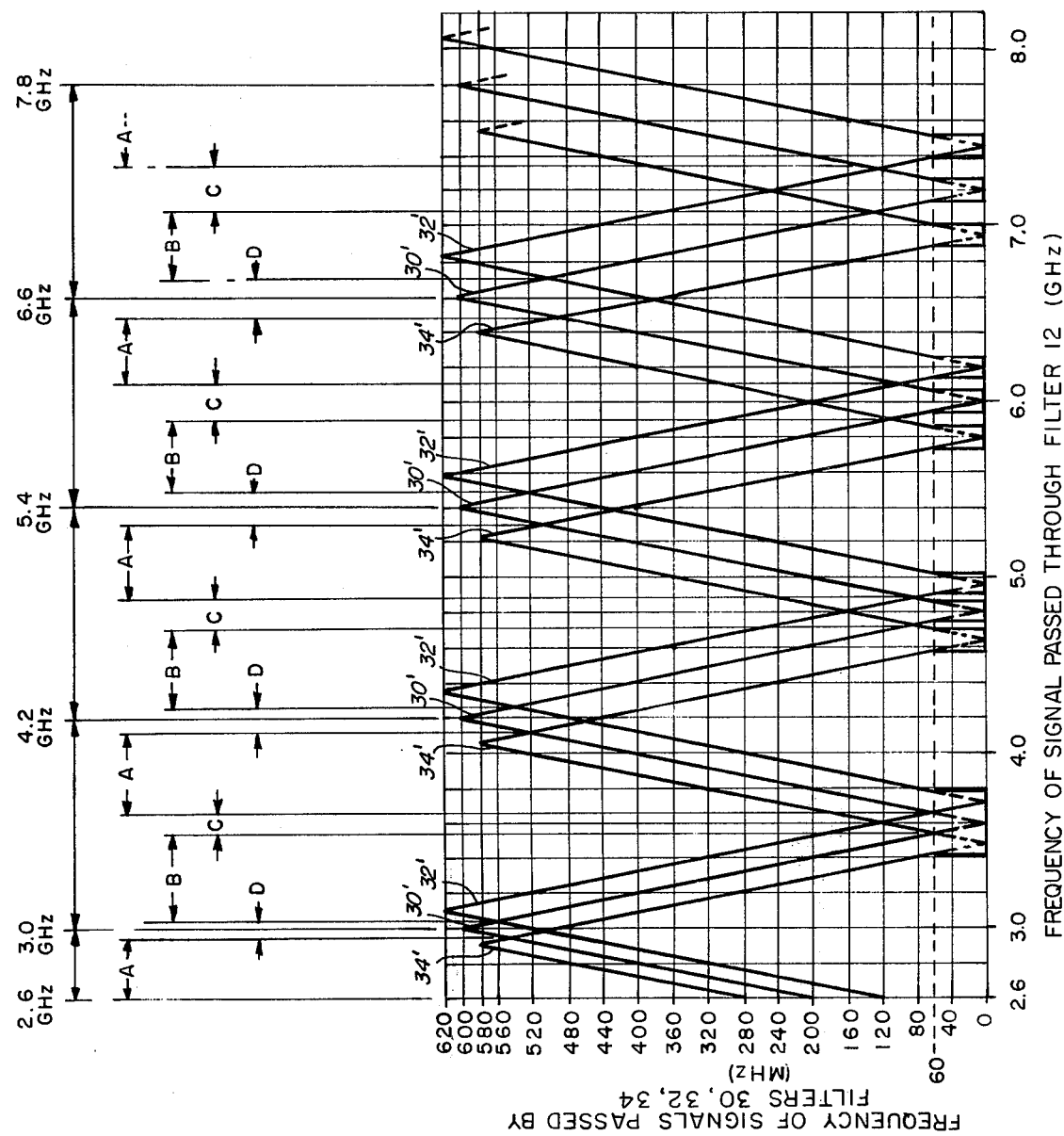

In order to determine the frequency of the signal passed by filter 12 when such signal has a frequency in the band where a fixed difference frequency relationship does not exist the mixer 20 and filter 34 are provided. Filter 34 is a bandpass filter of conventional design coupled to the output of mixer 20. The bandpass filter 34 rejects signals passed thereto having frequencies greater than 580 MHz. It is noted that such cutoff frequency is equal to one-half of the fundamental frequency of the harmonic signals fed to mixer 20. (It is also noted that filter 32 rejects signals having frequencies lower than 60 MHz to remove noise, the effect of which will be discussed.) The mixer 20 therefore produces a group of thirteen beat frequency signal pairs, each beat frequency signal passing through filter 34 as a result of a corresponding one of the harmonics produced by mixer 20 in a manner similar to that discussed above in connection with mixers 16 and 18. The relationship between the beat frequency and each one of the beat frequency signals passed by filter 34 as a function of the frequency of the signal passed by filter 12 is shown by the curve 34' in FIG. 5 for the lower portion of the operating band. The beat frequency signals passed by filters 32, 30 are also shown in FIG. 5 by curves 32', 30', respectively. It is noted that a constant frequency difference exists between at least two of the curves. In the bands labelled "A" (where the frequency of the signals out of filter 34, $f_{34}$, is greater than the frequency of the signals out of filter 30, $f_{30}$, and the frequency of the filter 30, $f_{30}$, is greater than the frequency of the signals out of filter 32, $f_{32}$, i.e. $f_{34} > f_{30}$ and $f_{30} > f_{32}$) there is a constant frequency difference of $\Delta f_1$ of either $(f_{34}-f_{30})$ or $(f_{30}-f_{32})$, the former difference occurring when $(f_{34}-f_{30}) > (f_{30}-f_{32})$ and the latter frequency difference occurring when $(f_{30}-f_{32}) > (f_{34}-f_{30})$. If the frequency of the signal passed by filter 12 is within the bands labelled "A" [i.e. if such $(f_{34} > f_{30})$ and $(f_{30} > f_{32})$] then the frequency of such signal, f, is $$f = 1.2 \frac{\Delta f_1}{40} + 10^{-3} f_{30} \text{ (GHz)} \quad (3)$$

where $\Delta f_1$ is the greater of either $(f_{34}-f_{30})$ or $(f_{30}-f_{32})$.

In the bands labelled "B" (where $f_{34} \leq f_{30}$ and $f_{30} \leq f_{32}$) a constant frequency difference $\Delta f_2$ exists of either $(f_{30}-f_{34})$ or $(f_{32}-f_{30})$, the former difference occurring when $(f_{30}-f_{34}) > (f_{32}-f_{30})$ and the latter occurring when $(f_{32}-f_{30}) > (f_{30}-f_{34})$. Therefore, if the signal passed by filter 12 is within the bands labelled "B" [i.e. if $(f_{34} \leq f_{30})$ and $(f_{30} \leq f_{32})$] then the frequency of such signal, f, is $$f = 1.2 \frac{\Delta f_2}{40} - 10^{-3} f_{30} \text{ (GHz)} \quad (4)$$

where $\Delta f_2$ is the greater of either $(f_{30}-f_{34})$ or $(f_{32}-f_{30})$. If the signal passed by filter 12 is within the bands labelled "C", $f_{30} < f_{34}$ and $f_{30} \leq f_{32}$. In such region the sum of $f_{32}$ and $f_{34}$ is a constant. For example, in the band C in the bandwidth 3.0 to 4.2 GHz the constant is (240 MHz). That is, here $(f_{32}+f_{34}) = 240$ MHz. In band C of the bandwidth 4.2 to 5.4 GHz the constant $(f_{32}+f_{34}) = 320$ MHz. It follows that in band C for the succeeding bandwidths 4.2 to 5.4 GHz, etc., the constants increase sequentially by 80 MHz. Therefore, if the frequency of the signal passed by filter 12 is within the bands labelled "C" (i.e. if $f_{30} < f_{34}$ and $f_{30} \leq f_{32}$) then $$f = (1.24) \frac{f_{32} + f_{34}}{80} - 10^{-3} f_{32} \text{ (GHz)} \quad (5)$$

or $$f = 1.16 \frac{(f_{32} + f_{34})}{80} + 10^{-3} f_{34} \text{ (GHz)} \quad (6)$$

Finally, if the signal passed by filter 12 is within the bands labelled "D" (i.e. $f_{30} \geq f_{34}$ and $f_{30} > f_{32}$) then the sum of $f_{32}$ and $f_{34}$ is also a constant. Further, as in the case considered in connection with band C, the constant is different for each one of the band D's. If the frequency of the signal passed by filter 12 is within band D (i.e. $f_{30} \leq f_{34}$ and $f_{30} > f_{32}$) the frequency of such signal f is $$f = 1.24 \frac{[1160 - (f_{32} + f_{34})]}{80} + 10^{-3} f_{32} \text{ (GHz)} \quad (7)$$

or $$f = 1.16 \frac{[1240 - (f_{32} + f_{34})]}{80} - 10^{-3} f_{34} \text{ (GHz)} \quad (8)$$

The beat frequency signals passed by filters 30, 32, 34 are fed to conventional digital counters 50, 52, 54, respectively, through gates 51, 53, 55, respectively, as shown, and to threshold detectors 56, 58, 60 respectively, as shown in FIG. 1. When a radio frequency signal of predetermined strength is received by antenna 14 the outputs of detectors 58, 56, 60 go "high" and pass through AND gate 62. Then AND gate 62 produces a high signal on line START which places flip/flop 63 in a set condition i.e. line E goes high and line $\overline{E}$ goes low). The high signal on line E enables the signals produced at the outputs of filters 32, 30, 34 to pass through gates 51, 53, 55 to counters 52, 50, 54, respectively. Counters 50, 52, 54 are of conventional design and count the number of cycles (i.e. "zero crossings", here as the voltage goes from positive to negative (negative going)) of the beat frequency signals passed thereto. Note that the maximum frequency of the beat frequency signals is here 620 MHz and hence such counters may be of conventional design. Also, in response to the high signal on line E clock pulses from clock 66 pass to counter 64 through gate 61. Here clock 66 is a 100 megacycle clock. The output of counter 64 is passed to a comparator 68. Also fed to comparator 68 is a register 70. Register 70 has stored therein a digital word, here $(10)_{10}$, to enable the output of comparator 68, i.e. line STOP, to produce a low signal when less than 0.1 microseconds has passed since line START went high and produce a high signal when exactly 0.1 microsecond has passed. The high signal on line STOP causes the flip/flop 63 to reset (producing a low signal on line E and a high signal on line $\overline{E}$). The low signal on line E prevents or inhibits further counting by counters 52, 50, 54 and 66 because of gates 51, 53, 55 and 61, respectively. It follows then that such counters count for exactly 0.1 microseconds after detection of a received signal (i.e. after line START goes high) and therefore the digital word stored in such counters 50, 52, 54 represents the frequency of the beat frequency signals in tens of megahertz (MHz). (Example: Count 7 implies 70 MHz.) Line E is coupled to delay network 65. The signal produced at the output of delay network 65 (on line TRANSFER) is fed to registers 53, 55, 57 to enable such registers to store the digital words in counters 52, 50, 54, respectively, a short time (as provided by delay network 65) after the end of the 0.1 microsecond period. The digital words stored in registers 53, 55, 57 therefore represent the frequency of the beat frequency signals passed by filters 32, 30, 34, respectively. Such digital words appear on lines (or buses) designated as $DW_{32}$, $DW_{30}$, $DW_{34}$, respectively. The registers 53, 55, 57 are fed to a logic network 80, the details of which will be discussed in connection with FIG. 6. Suffice it to say here, however, that logic network 80 in effect implements Equations (3), (4), (5) and (7) to produce a digital word at the output of such logic network 80 which represents the frequency of the signal passed through filter 12 (FIG. 1). Such digital word is passed to a conventional display 82 which is enabled by the signal at terminal 84. The TRANSFER line is coupled to terminal 84 via a delay network 88 and therefore the digital word produced by logic network 80 (the word representative of the frequency of the signal passing through filter 12) is displayed on display 82 shortly after the contents of registers 53, 55, 57 are passed to the logic network 80. The display 82, counters 52, 50, 54 and 64 and the registers 53, 55, 57 are reset by the signal on line RESET each time a new signal is detected. The signal on line RESET is produced by passing the signal on the TRANSFER line to a delay network 67. Such network 67 enables the display 82 to display the calculated frequency for a predetermined time, here sufficient to enable recording of the displayed frequency of the received radio frequency input signal.

Figure 6:
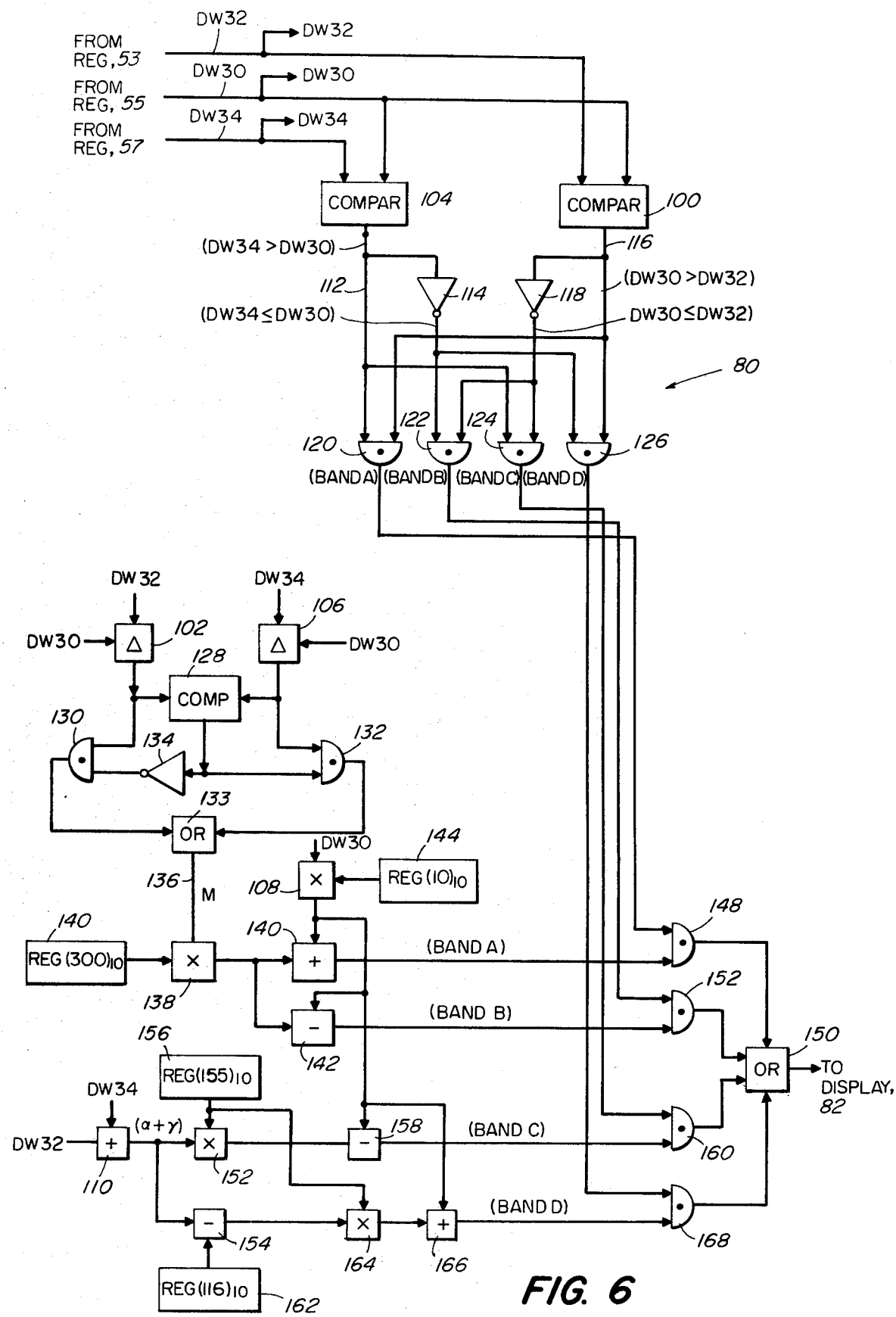
FIG. 6 is a block diagram of a logic network used in the frequency measuring apparatus shown in FIG. 1.

Referring now to FIG. 6, bus DW32 is coupled to comparator 100, adder 110 and differencing network 102. Bus DW30 is coupled to comparator 100, comparator 104, differencing networks 102, 106, and multiplier 108, as shown. Bus DW34 is coupled to comparator 104, differencing network 106 and summer 110, as shown. Comparator 104 produces a high signal (logical 1) on bus 112 only when the digital word on bus DW34 is greater than the digital word on bus DW30. Bus 112 is fed to an inverter network 114 so that the output of such network 114 is high only when the digital word on bus DW34 is less than or equal to the digital word on bus DW32. Comparator 100 produces a high signal on line 116 only when the digital word on bus DW30 is greater than the word on DW32. Bus 116 is fed to an inverter network 118 so that the output of such network 118 is high only when the digital word on bus DW30 is less than or equal to the digital word on bus DW32. AND gate network 120 is coupled to bus 112 and bus 116 and hence such AND gate network 120 produces a high signal only when (1) the digital word on bus DW34 is greater than the digital word on bus DW30, and (2) the digital word on bus DW30 is greater than the digital word on bus DW32. It follows then that the output of AND gate network 120 is high only when the signal passed through filter 12 (FIG. 1) has a frequency in the band A regions.

The AND gate network 122 is coupled to inverter networks 114 and 118, as shown. Such AND gate network 122 produces a high signal only when (1) the digital word on bus DW34 is less than or equal to the digital word on bus DW30, and (2) the digital word on bus DW30 is less than or equal to the digital word on bus DW32. It follows then that the output of AND gate network 122 is high only when the signal passed through filter 12 (FIG. 1) has a frequency in the band B regions.

An AND gate network 124 is coupled to bus 112 and inverter network 118. Such AND gate network 124 produces a high signal only when (1) the digital word on bus DW34 is greater than the digital word on bus DW30; and (2) the digital word on bus DW30 is less than or equal to the digital word on bus DW32. It follows then that the output of AND gate network 124 is high only when the signal passed through filter 12 (FIG. 1) has a frequency in the band C regions.

An AND gate network 126 is coupled to inverter network 114 and bus 116. Such AND gate network 126 produces a high signal only when (1) the digital word on bus DW 34 is less than or equal to the digital word on bus DW30, and (2) the digital word on bus DW30 is greater than the digital word on bus DW32. It follows then that the output of AND gate network 126 is high only when the signal passed through filter 12 (FIG. 1) has a frequency in the band D regions.

The Equation (3) may be expressed as follows in terms of the digital words on buses DW30, DW32, DW34: If the signal passed through filter 12 (FIG. 1) has a frequency in the band A regions the output of AND gate network 120 is high and the frequency of such signal f is $$f = 300M + 10\beta \tag{9}$$

where M is the greater of (a) the digital word on bus DW30 minus the digital word on bus DW34 or (b) the digital word on bus DW32 minus the digital word on bus DW30 and $\beta$ is the digital word on bus DW30. The difference between the digital words on buses DW30 and DW32 is computed by differencing network 102 and the difference between digital words on buses DW30 and DW34 by differencing network 106. The output of such network 102 is fed to comparator 128 and AND gate network 130. The output of a differencing network 106 is fed to comparator 128 and AND gate network 132. The output of comparator 128 is fed to AND gate network 132 and to inverter network 134. The output of inverter network 134 is fed to AND gate network 130. The outputs of AND gate networks 130, 132 are fed to an OR gate network 133, as shown. In operation if the output of differencing network 102 is greater than the output of differencing network 106, the output of comparator 128 goes low, the output of inverter network 134 goes high and the output of differencing network 102 passes through AND gate network 130 and OR gate network 133 to bus 136. Conversely, if the output of differencing network 106 is greater than the output of differencing network 102, the output of comparator 128 goes high and the contents of differencing network 106 passes to bus 136. It follows then bus 136 will contain the digital word M (Equation 9).

The digital word M on bus 136 is fed to a multiplier 138. Also fed to multiplier 138 is a register 140. Register 140 has stored therein a digital word representative of $(300)_{10}$. The output of multiplier 138 is therefore a digital word representative of 300M. Such digital word is passed to an adder 140 and a subtractor 142, as shown. Also fed to adder 140 is a multiplier 108. Fed to such multiplier 108 is bus DW30 and register 144. Register 144 stores a digital word representative of $(10)_{10}$. It follows then that the output of adder 140 is a digital word representative of $300M + 10\beta$. Such digital word passes through AND gate network 148 in response to a high signal at the output of AND gate network 120. The output of AND gate network 148 is coupled to OR gate network 150, the output of which is coupled to display 82 (FIG. 1). It follows then that if the signal passed through filter 12 (FIG. 1) has a frequency in the band A regions the digital word passed to the display represents the frequency of such signal in MHz.

Equation (4) may be expressed as follows in terms of the digital words on buses DW30, DW32, DW34: If the signal passed through filter 12 (FIG. 1) has a frequency in the band B regions the output of AND gate network 122 is high and the frequency of such signal f is:

$$f = 300M - 10\beta \qquad (10)$$

Referring to FIG. 6, a digital word representative of such frequency f is produced at the output of subtractor 142 because such subtractor 142 is coupled to multiplier 138 and multiplier 108. It follows then that because the output of AND gate network 122 is high when the signal passes through filter 12 (FIG. 1) has a frequency in the band B regions, the digital word representative of such frequency in MHz passes through AND gate network 152 and OR gate network 150 to display 82 (FIG. 1).

Considering now Equation (5), such equation may be expressed as follows in terms of the digital words or buses DW30, DW32, DW34: If the signal passed through filter 12 (FIG. 1) has a frequency in the band C regions the output of AND gate network 124 goes high and the frequency of such signal f is $$f = 155(\alpha+\gamma) - 10\alpha \qquad (11)$$

where $\alpha$ is the digital word on bus DW32 and $\gamma$ is the digital word on bus DW34.

Adder 110 forms the term $(\alpha+\gamma)$ because it is coupled to buses DW32 and DW34. The output of adder 110 is fed to a multiplier 152 and a subtractor 154, as shown. Also fed to multiplier 152 is a register 156, such register 156 having stored therein a digital word representative of $(155)_{10}$. The output of multiplier 152 therefore produces a digital word representative of 155 $(\alpha+\gamma)$. Such digital word is passed to subtractor 158 along with the output of multiplier 108 (which produces a digital word representative of $10\alpha$). It follows then that when the signal passed through filter 12 (FIG. 1) has a frequency in the band C regions, AND gate network 124 enables the digital word produced by subtractor 158 to pass through AND gate network 160 and OR gate network 150 to display 82 (FIG. 1), such digital word representing the frequency of such signal in MHz.

Considering now Equation (7), such equation may be expressed as follows in terms of the digital words on buses DW30, DW32, DW34: If the signal passed through filter 12 has a frequency within the band D regions the output of AND gate network 126 is high and the frequency of such signal f is $$f = 155[116-(\alpha+\gamma)] + 10\alpha \qquad (12)$$

To form such equation the quantity $(\alpha+\gamma)$ produced by adder 110 is fed to subtractor 154. Also fed to such subtractor is a register 162. Register 162 has stored therein a digital word representative of $(116)_{10}$. It follows then that the output of subtractor 154 is a digital word representative of $116-(A+C)$. The output of subtractor 154 is coupled to multiplier 164. Also coupled to multiplier 164 is register 156. It follows then that the output of multiplier 164 is a digital word representative of $155[116-(\alpha+\gamma)]$.

The output of multiplier 164 is coupled to an adder 166. Also coupled to adder 166 is the output of multiplier 108. It follows then that the output of adder 166 is a digital word representative of the frequency of the signal passed through filter 12 (FIG. 1) when the frequency of such signal is in the band D regions and such digital word passes through AND gate network 168 in response to a high signal produced by AND gate network 126, to OR gate 150 and finally to display 82 (FIG. 1).

Figure 7:
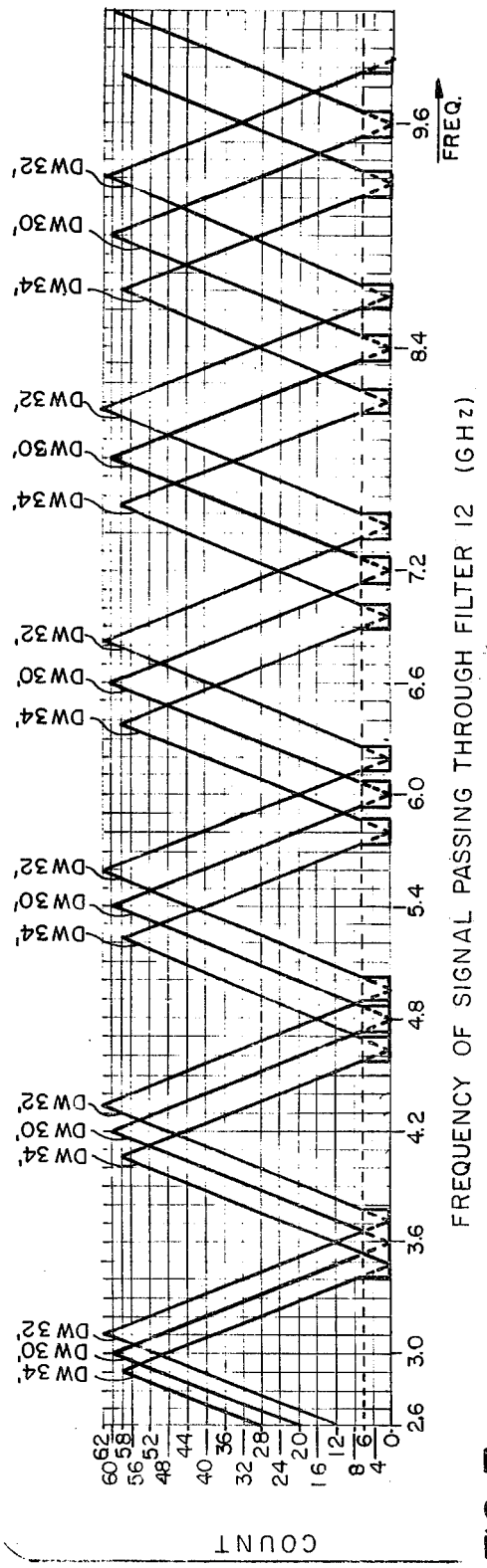
FIG. 7 is a diagram useful in understanding the operation of the frequency measuring apparatus shown in FIG. 1.
Figure 7:
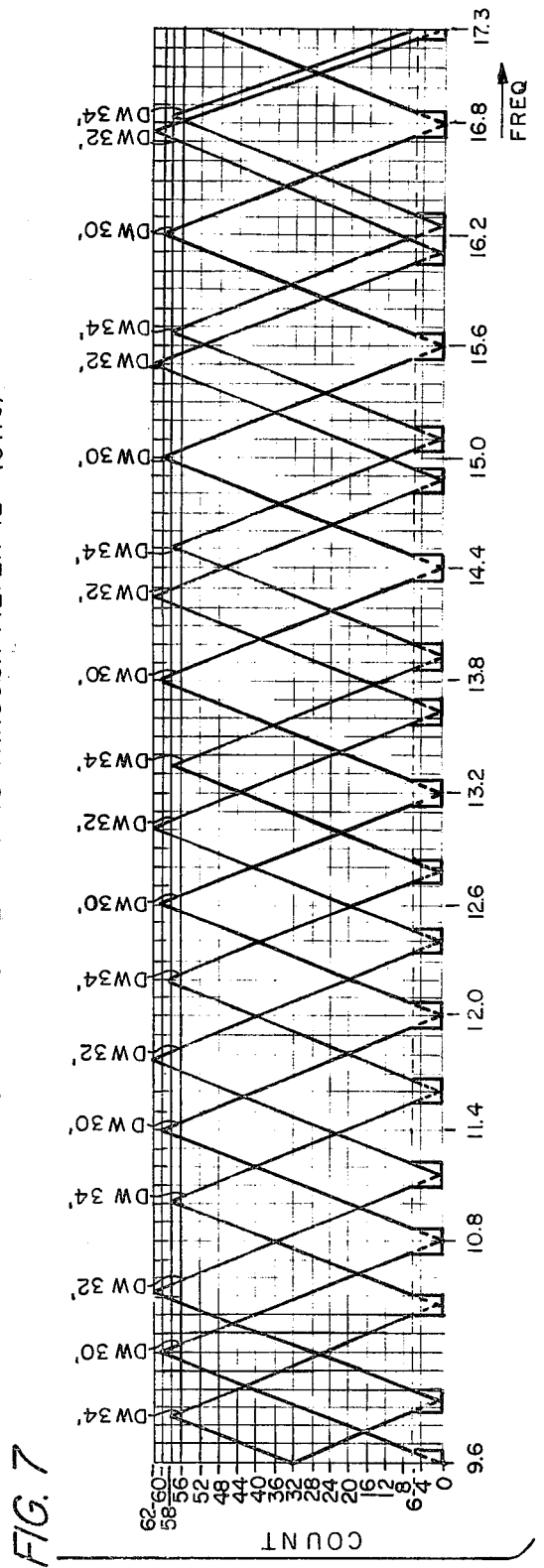

Referring now to FIG. 7, the contents of the counters 52, 50, 54 (i.e. "count") are shown by the curves labelled DW32', DW30' and DW34', respectively. It is noted that the logic networks calculates the frequency of the signal passed through filter 12 from 2.6 to 17.3 GHz with unambiguous results. The overall range of the receiver can be shown to be approximately $F^2/2\Delta$ when F is the fundamental frequency of the central one of the three local oscillators, i.e. local oscillator 24, F = 1.2 GHz, and $\Delta$ represents the spacing between the oscillators, here 40 MHz. Therefore, the overall range is about 18 GHz. From this it can be seen that a small increase in F can produce a relatively large increase in range; similarly, a decrease in $\Delta$ will increase the range. The 40 MHz $\Delta$ was chosen to allow for a one count (plus or minus) error in the counters. It is further noted that by selecting a lower frequency limit of 60 MHz for filters 30, 32, 34 to eliminate noise such limit does not produce ambiguous results. This is because in this low frequency region the calculation of frequency is not affected if the count is between 0 and 6. (See FIG. 7).

Having described a preferred embodiment of this invention, it is evident that other embodiments incorporating these concepts may be used. For example, other logic networks may be used to calculate the frequency of the received signal from the count stored in registers 50, 52 and 54. It is felt, therefore, that this invention should not be restricted to the disclosed embodiment but rather should be limited only by the spirit and scope of the appended claims.

What is claimed is:
1. Frequency measuring apparatus, comprising:
 (a) means for mixing an input signal with sets of signals producing a plurality of groups of beat frequency signals, each group of beat frequency signals being produced by mixing the input signal with a corresponding one of a plurality of sets of harmonic signals, such sets of harmonic signals being harmonic signals of different fundamental frequency signals;
 (b) a plurality of filters, each one being fed by a corresponding one of the groups of beat frequency signals, for rejecting the beat frequency signals in such groups having frequencies greater than different predetermined frequencies;
 (c) counter means, coupled to the filters, for counting the number of cycles of the beat frequency signals fed thereto by the filters in a predetermined time interval for converting the frequencies of the beat frequency signals passed thereto by the filters to corresponding digital words; and
 (d) means for determining the frequency of the input signal in response to the digital words.

2. The apparatus recited in claim 1 wherein the predetermined frequency of each one of the filters is one-half the fundamental frequency of the set of signals producing the group of beat frequency signals fed to such one of the filters.

3. The apparatus recited in claim 1 wherein the counter means includes a plurality of counters, each one being coupled to the output of a corresponding one of the plurality of filters.

4. The apparatus recited in claim 3 wherein the frequency measuring apparatus includes three filters and three counters coupled to such filters.

5. Frequency measuring apparatus comprising:
   (a) oscillator means for producing a plurality of sets of signals, each set of signals being harmonic signals of a different fundamental frequency signal;
   (b) heterodyning means for mixing an input signal with the sets of signals producing a plurality of groups of beat frequency signals, each group of beat frequency signals being produced by mixing the input signal with a corresponding one of the sets of signals;
   (c) a plurality of filters, each one fed by a corresponding one of the group of beat frequency signals for rejecting the beat frequency signals in such group having frequencies greater than one-half the fundamental frequency of the set of signals producing the group of beat frequency signals fed to such one of the filters;
   (d) means including a plurality of counters, each one being coupled to the output of the corresponding one of the filters for converting the frequency of each one of the plurality of beat frequency signals passed thereto by the filters to a corresponding plurality of digital words; and
   (e) means for determining the frequency of the input signal in response to the digital words.

6. The apparatus recited in claim 5 wherein the oscillator means produces three sets of harmonic signals, such sets being harmonics of fundamental frequency signals having frequencies $f_1$, $f_2$ and $f_3$ and wherein the plurality of filters includes three filters for rejecting beat frequency signals having frequencies greater than $f_1/2$, $f_2/2$ and $f_3/2$, respectively.

7. The apparatus recited in claim 5 wherein the determining means includes means for arithmetically combining the digital words produced by the plurality of counters to determine the frequency of the input signal.

8. The apparatus recited in claim 7 wherein the determining means includes means responsive to the relative magnitudes of the digital words and differences between selected ones of such digital words to determine the frequency of the input signal.

9. Apparatus for determining the frequency of an input signal, comprising:
   (a) oscillator means for producing a plurality of sets of harmonic signals, such sets of harmonic signals having different fundamental frequencies;
   (b) a plurality of mixers, each one being fed by a corresponding one of the sets of harmonic signals and the input signal;
   (c) a plurality of filter means, each one being fed by a corresponding one of the plurality of mixers and each one of such filter means having a different cutoff frequency, for rejecting signals fed thereto having frequencies greater than such cutoff frequency and for passing signals fed thereto having frequencies less than such cutoff frequency;
   (d) a plurality of counter means, each one thereof being fed by a corresponding one of the plurality of filter means for producing a digital word representative of the frequency of the signal passed thereto by such corresponding one of the plurality of filter means; and
   (e) electronic means for arithmetically combining the digital words produced by the plurality of counter means to determine the frequency of the input signal.

10. The apparatus recited in claim 9 wherein the electronic means includes means for determining the relative magnitudes of selected ones of the digital words.

11. The apparatus recited in claim 9 wherein the electronic means includes means for determining differences between selected ones of the digital words.

12. The apparatus recited in claim 7 wherein the cutoff frequencies of the plurality of filter means are one-half the fundamental frequencies of the harmonic signals fed to the mixers fed to such plurality of filters.

* * * * *

UNITED STATES PATENT OFFICE
CERTIFICATE OF CORRECTION

Patent No. 4,137,497          Dated January 30, 1979

Inventor(s) Oscar Lowenschuss

It is certified that error appears in the above-identified patent and that said Letters Patent are hereby corrected as shown below:

Column 12, line 40, delete "7" and replace with -- 9 --.

Signed and Sealed this

Fifteenth Day of April 1980

[SEAL]

Attest:

SIDNEY A. DIAMOND

Attesting Officer      Commissioner of Patents and Trademarks